(12) United States Patent
Lam et al.

(10) Patent No.: US 6,548,418 B2
(45) Date of Patent: Apr. 15, 2003

(54) DUAL LAYER ETCH STOP BARRIER

(75) Inventors: Chung Hon Lam, Williston, VT (US); Eric Seung Lee, Essex Junction, VT (US); Francis Roger White, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/158,249

(22) Filed: May 30, 2002

(65) Prior Publication Data

US 2002/0145179 A1 Oct. 10, 2002

Related U.S. Application Data

(62) Division of application No. 09/031,251, filed on Feb. 26, 1998, now Pat. No. 6,420,777.

(51) Int. Cl.[7] ..................... H01L 21/302; H01L 21/461; H01L 21/4763

(52) U.S. Cl. ................ 438/723; 438/634; 438/637; 438/724; 438/740; 438/970

(58) Field of Search ................... 438/723, 724, 438/621, 624, 705–707, 712–713, 717, 738, 740, 634, 744, 756, 757, 791–794, 970; 257/640, 635, 637, 649, 774

(56) References Cited

U.S. PATENT DOCUMENTS

| | | | | |
|---|---|---|---|---|
| 4,342,617 A | * | 8/1982 | Fu et al. ..................... | 438/701 |
| 5,444,653 A | * | 8/1995 | Nagasawa et al. .......... | 365/149 |
| 5,459,354 A | * | 10/1995 | Hara ........................... | 257/754 |
| 5,702,989 A | * | 12/1997 | Wang et al. ................ | 438/397 |
| 5,811,357 A | * | 9/1998 | Armacost et al. ........... | 438/723 |
| 5,897,372 A | * | 4/1999 | Howard ....................... | 438/637 |
| 5,940,732 A | * | 8/1999 | Zhang ......................... | 438/640 |

OTHER PUBLICATIONS

"Characterization of Plasma–Enhanced Chemical Vapor Deposited Nitride Films Used in Very Large Scale Integrated Applications", A.K. Stamper and S.L. Pennington, J. Electrochem, Soc., vol. 140, No. 6, Jun. 1993. Pages 1748–1752.

"Thin Film of Lithium Nioblum Oxynitride as Ionic Conductor", Le Quang Nguyen and Vo–Van Truong, 1996, American Institute of Physics, pp. 2914–2917.

"Ion Transport Phenomena in Insulating Films", E.H. Snow, A.S. Grove, B.E. Deal, and C.T. San, Journal of Applied Physics. vol. 30., pp. 1664–1671.

"1994 International Integrated Reliability Workshop Final Report", Stanford Sierra Camp, Lake Tahoe, California, Oct. 16–19, 1994. (2 pages).

"1994 ieee international reliability physics proceedings", 1994, Institute of Electrical and Electronic Engineers, Inc. (4 pages).

* cited by examiner

Primary Examiner—Shouxiang Hu
(74) Attorney, Agent, or Firm—William N. Hogg

(57) ABSTRACT

A method for reactive ion etching of $SiO_2$ and an etch stop barrier for use in such an etching is provided. A silicon nitride ($Si_xN_y$) barrier having a $Si_x$ to $N_y$ ratio (x:y) of less than about 0.8 and preferably the stoichiometric amount of 0.75 provides excellent resilience to positive mobile ion contamination, but poor etch selectivity. However, a silicon nitride barrier having a ratio of $Si_x$ to $N_x$ (x:y) of 1.0 or greater has excellent etch selectivity with respect to $SiO_2$ but a poor barrier to positive mobile ion contamination. A barrier of silicon nitride is formed on a doped silicon substrate which barrier has two sections. One section has a greater etch selectivity with respect to silicon dioxide than the second section and the second section has a greater resistance to transmission of positive mobile ions than the first section. One section adjacent the silicon substrate has a silicon to nitrogen ratio of less than about 0.8. The second section, formed on top of the first section is formed with the ratio of the silicon to nitrogen of greater than about 0.8. Preferably the two sections together are from about 50 to about 100 nanometers thick.

9 Claims, 4 Drawing Sheets

DUAL LAYER ETCH STOP BARRIER

CROSS REFERENCE TO RELATED APPLICATION

This application is a divisional of application Ser. No. 09/031,251, filed Feb. 26, 1998, now U.S. Pat. No. 6,420,777.

BACKGROUND OF THE INVENTION

This invention relates generally to the manufacture of integrated circuit (I/C) chips and particularly to the fabrication or processing of a silicon substrate to form the circuitry for the I/C chip. During one stage of manufacture of I/C chips, a silicon dioxide layer is applied over a silicon substrate. The silicon dioxide must be etched at various places to provide openings to the substrate for electrical connections. One conventional technique of etching is by means of reactive ion etching (RIE). With reactive ion etching it is conventional to provide an etch stop barrier between the silicon substrate and the silicon dioxide layer formed thereon. One conventional etch stop barrier is silicon nitride ($Si_xN_y$). These silicon nitride barriers are conventionally deposited by low pressure chemical vapor deposition (LPCVD) utilizing conventional equipment. In one embodiment mixtures of silane ($SiH_4$) and ammonia ($NH_3$) are utilized as an ambient to provide the necessary silicon and nitrogen moieties for the formation of the silicon nitride.

However, it has been found in the past that there were variations from process to process of forming the $Si_xN_y$ barrier in the effectiveness of the nitride barrier in its selectivity with respect to $SiO_2$ when reactive ion etching the $SiO_2$. When etching $SiO_2$ it is desirable to have as much selectivity as possible of the etch stop with respect to the $SiO_2$ so as to allow a minimum thickness of the etch stop to be applied. It was also found that there were variations in the resulting barrier in the effectiveness of the silicon nitride to prevent passing of positive mobile ions (PMI) which may occur during subsequent processing due primarily to contaminants introduced into the $SiO_2$ layer. Positive mobile ion contamination (PMIC) such as in a gate oxide of CMOS devices must be reduced to a minimum. Thus a requirement of the silicon nitride barrier is that it act to effectively block positive mobile ions from penetrating into the substrate during subsequent processing steps.

Therefore it is desirable to provide a silicon nitride barrier that is both highly selective to etching of $SiO_2$ and also effective to block the passage of positive mobile ions in subsequent processing steps.

SUMMARY OF THE INVENTION

According to the present invention, a method for reactive ion etching of $SiO_2$ with an etch stop barrier for use in such an etching is provided. It has been found that a silicon nitride ($Si_xN_y$) barrier having a $Si_x$ to $N_y$ ratio (x:y) of less than about 0.8 and preferably the stoichiometric amount of 0.75 provides excellent resilience to positive mobile ion contamination, but poor etch selectivity. However, a silicon nitride barrier having a ratio of $Si_x$ to $N_y$ (x:y) of 1.0 or greater has excellent etch selectivity with respect to $SiO_2$ but a poor barrier to positive mobile ion contamination. The technique of the present invention includes providing a substrate which conventionally is a doped silicon substrate, and forming a barrier of silicon nitride on the substrate which barrier has two sections or layers. One section has a greater etch selectivity with respect to silicon dioxide than the second section and the second section has a greater resistance to transmission of positive mobile ions than the first section. Preferably the two sections are formed by forming one section, referred to as the lower section adjacent to silicon substrate with a silicon to nitrogen ratio of less than about 0.8 and preferably about 0.75 which is the stoichiometric ratio of silicon to nitrogen. The second section, or upper section is preferably formed with the ratio of the silicon to nitrogen of greater than about 0.8 and preferably at least about 1.0. Preferably the two sections together are from about 50 to about 100 nanometers thick and in the preferred embodiment, each section is about 25 to 50 nanometers thick.

DESCRIPTION OF THE PREFERRED EMBODIMENT

The use of silicon nitride as an etch stop barrier is well known in the art especially for stopping the etch during reactive ion etching (RIE) of silicon dioxide disposed over a silicon or doped silicon substrate in the manufacture of integrated circuit chips. Reactive ion etching is used in chip manufacturing to form openings through the silicon dioxide so as to provide access to the substrate. Typically the opening will be filled with metal such as tungsten or other metal as is well known. In etching the silicon dioxide an etch stop layer is used so as to allow the etching to stop or essentially terminate once the etching has penetrated through the silicon dioxide layer. Expressed another way, when the etching has pierced the silicon dioxide layer it is desired that the etching not continue to any significant extent. The barrier layer of etch stop material is to ensure that the etch stops substantially uniformly at all the various locations being etched through the silicon dioxide. Thus, one of the principal requirements of the etch stop material is that it have a relatively high selectivity of etching with respect to the material which is intended to be etched i.e. silicon dioxide. Expressed another way, once the silicon dioxide has been etched it is desirable that there be very little etching taking place after that.

Figure 1:
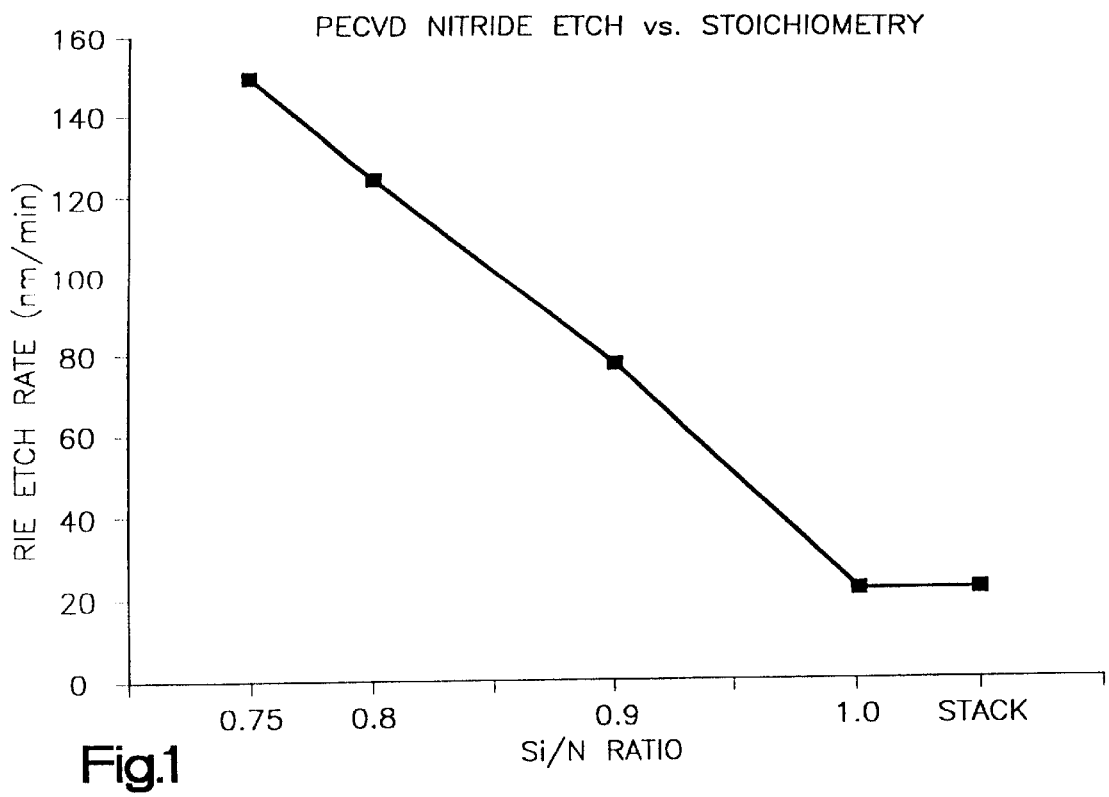
FIG. 1 is a graph of the etch rate of silicon nitride ($Si_xN_y$) in $Ar:CHF_3CF_4$ at various silicon to nitrogen ratios (x:y) of the silicon nitride.

FIG. 1 shows the etching rate of $Si_xN_y$ in nanometers per minute using an AME 5000 tool with $Ar:CHF_3$ atmosphere at various ratios of silicon to nitrogen in a silicon nitride ($Si_xN_y$) barrier. As can be seen, when the ratio of silicon to nitrogen is 0.75 (which is the stoichiometric ratio) the etch rate is between 140 and 160 nanometers per minute, but as the ratio of silicon to nitrogen increases, this etch rate decreases dramatically to a point where when the ratio of Si to N is about 1.0 the etch rate has dropped down to about 20 nanometers per minute. With a ratio greater than 1.0 no improvement in the etch rate resistance is achieved. Thus, based on this particular characterization, in order to get the lowest etch rate of silicon nitride and thus the highest etch selectivity, it is desirable to have a ratio of silicon to nitrogen of at least about 1.0.

Figure 2:
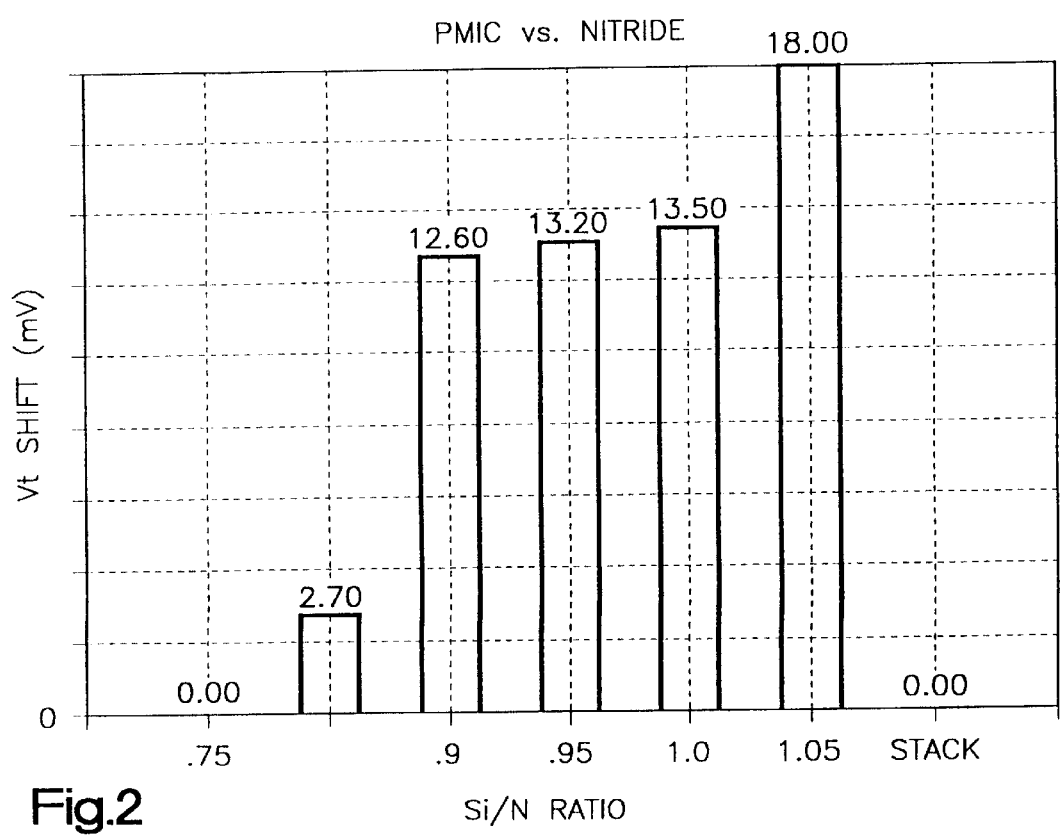
FIG. 2 is a bar graph showing the $V_t$ shift of a substrate after reactive ion etching using silicon nitride ($Si_xN_y$) barriers of various ratios of silicon to nitrogen (x:y)
Figure 3:
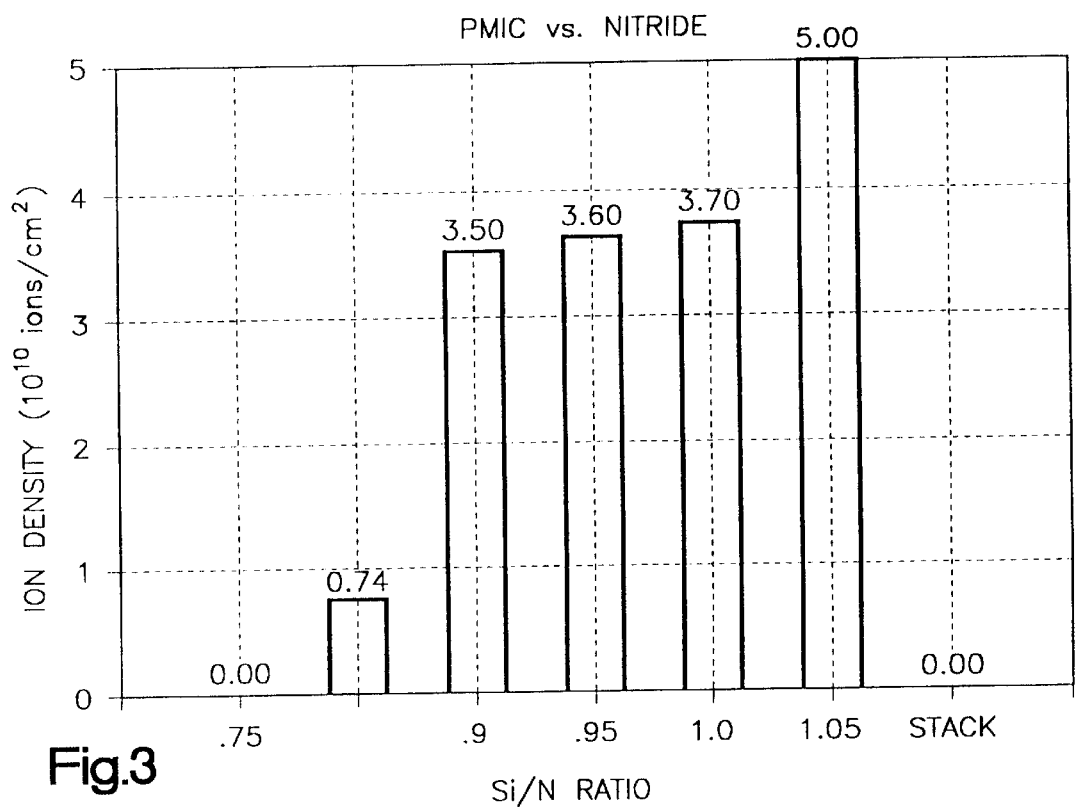
FIG. 3 is a graph similar to FIG. 2 graphing the positive ion density in the substrate as a function of the ratio of the silicon to nitrogen (x:y) in silicon nitride.

However, in subsequent processing during chip manufacture there can be generated positive mobile ions (PMI), in particular Na⁺ and K⁺, principally from contamination in the $SiO_2$ layer. If these positive ions diffuse even in small amounts into the silicon substrate they can cause significant degradation of the substrate material in some structures. Thus, it is desirable and often even necessary that these ions be essentially excluded from penetrating the barrier and diffusing into the substrate. FIGS. 2 and 3 show the amount of diffusion of positive mobile ions especially sodium (Na⁺) as measured by Vt Shift (mV) shown in FIG. 2 and ion density in $10^{10}$ Ions/cm² shown in FIG. 3 in substrates with $Si_xN_y$ nitride barriers having various ratios of Si to N in the silicon nitride. At a Si to N ratio of 1.05 there is a very high number of mobile ions passing through the silicon nitride barrier, and even at a ratio of 1.0 there is an appreciable amount of these ions penetrating; indeed even at a ratio of silicon to nitrogen of 0.8 there is a significant amount of PMIC (positive mobile ion contamination). It is not until the ratio of silicon to nitrogen is 0.75 (i.e. the stoichiometric ratio) that the PMIC is essentially eliminated.

Thus, if one were to design the barrier to maximize resistance to positive mobile ion penetration one would use a ratio of silicon to nitrogen of 0.75. However, as shown above, this would provide very poor etch selectivity. On the other hand, if one were to design for the best etch selectivity, one would design a nitride barrier having a ratio of silicon to nitrogen of 1.0 or greater; but this would provide poor resistance to positive mobile ion penetration.

According to the present invention, a barrier is provided which will achieve both high resistance to positive mobile ion penetration and very good etch selectivity with respect to $SiO_2$. This is accomplished by providing a barrier having two separate sections or layers. A first layer of silicon nitride is tailored to have excellent resistance to positive mobile ion penetration and thus has a ratio of silicon to nitrogen of less than about 0.8 and preferable about 0.75. A second layer of silicon nitride is provided which has a silicon to nitrogen ratio of greater than about 0.8 preferably about 1.05. This will provide excellent etch selectivity. By having a dual layer barrier as described, the barrier will provide not only good etch selectivity but resistance to positive mobile ion contamination.

Figure 4A:
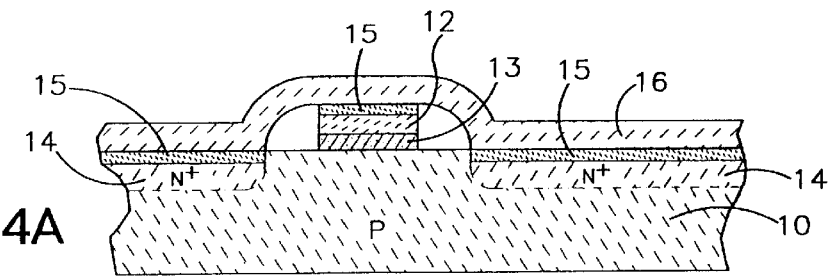
FIGS. 4A through 4G show the steps of the method of the present invention somewhat diagrammatically.

Referring now to FIGS. 4A through 4G, various steps of the present invention are depicted in very diagrammatic fashion. As seen in FIG. 4A a silicon substrate 10 is provided which has a gate device 12 separated from the substrate 10 by means of a gate oxide layer 13. The substrate has a region 14 of opposite polarity (shown as N⁺) on top of which is a silicided layer 15, which silicided layer 15 also overlies the gate 12.

A first layer of silicon nitride ($Si_xN_y$) 16 is deposited over the substrate 10 and the gate device 12. The first layer of silicon nitride 16 in the preferred embodiment is formed in an AME 5000 tool sold by Applied Materials, Inc. with an atmosphere of $SiH_4$ and $NH_3$ to form a silicon nitride having a ratio of silicon to nitrogen of about 0.75. The ratio of silicon to nitrogen is controlled by controlling the ratio of $SiH_4$ to $NH_3$ in a well known manner. Preferably this first layer 16 is from about 25 to about 50 nanometers thick.

Figure 4B:
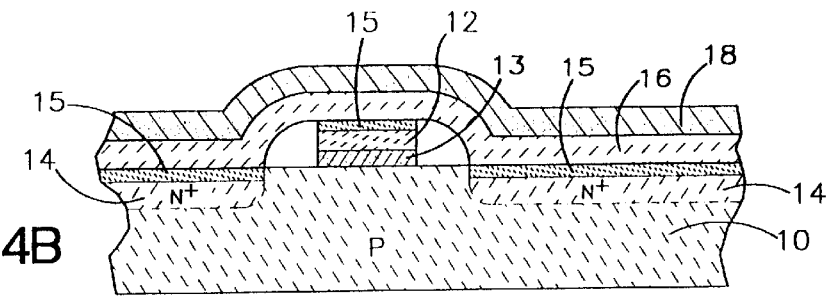

Following the deposition of the first layer 16 a second layer 18 of silicon nitride is deposited over the first layer 16 as shown in FIG. 4B. Again this is done in the AME 5000 tool in an atmosphere of $SiH_4$ and $NH_3$. The ratio of $SiH_4$ to $NH_3$ in forming this second layer 18 is controlled so as to form a silicon nitride with silicon to nitrogen ratio of at least 1.0 and preferably 1.05. This layer 18 is also formed to a thickness of about 25 to about 50 nanometers so that the total thickness of the first and second layers 16, 18 is from about 50 to about 100 nanometers. It is not critical whether the layer 16 or 18 is formed on the substrate; however in the preferred embodiment, the layer 16 is formed on the substrate 10 and the layer 18 is formed over the layer 16.

Figure 4C:
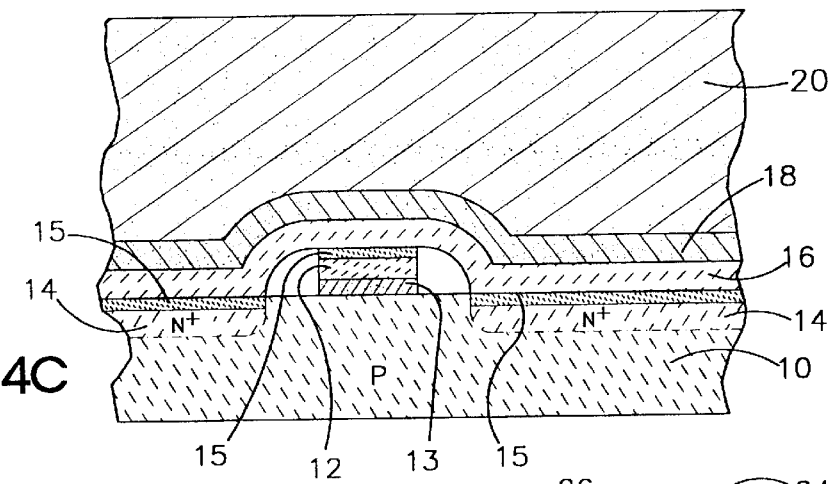

On top of the layer 18 is deposited a layer of silicon dioxide (TEOS) 20 preferably doped with boron (BSG) or phosphorous (PSG) or both (BPSG) as shown in FIG. 4C which also is formed in a conventional manner again using the AME 5000 tool. This layer 20 is conventionally at least about 0.6 microns thick.

Figure 4D:
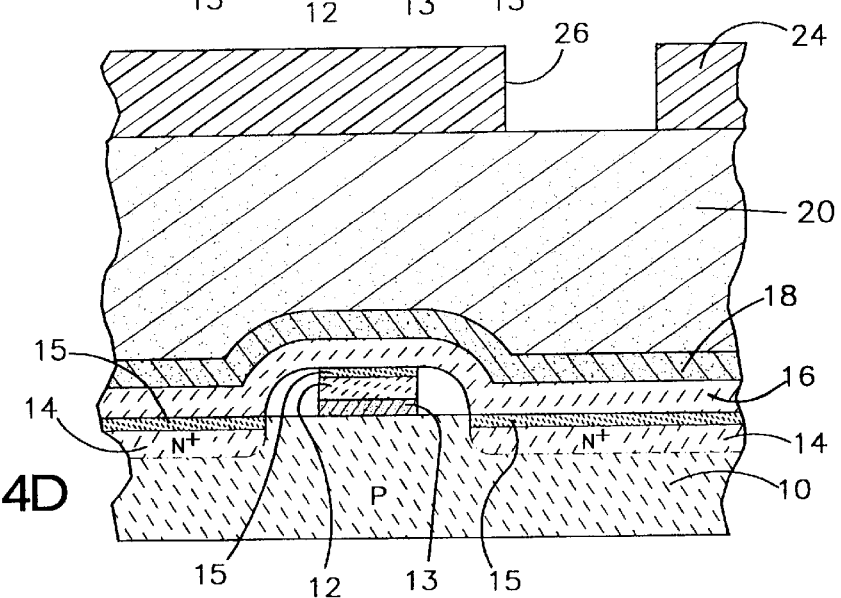

As shown in FIG. 4D surface 22 of the TEOS 20 is coated with a photoresist 24, which is photoimaged and developed in a conventional manner to provide openings one of which is shown at 26 in the photoresist 22. One photoresist that is especially useful is positive acting resist 5409 sold by Shipley Corp.

Figure 4E:
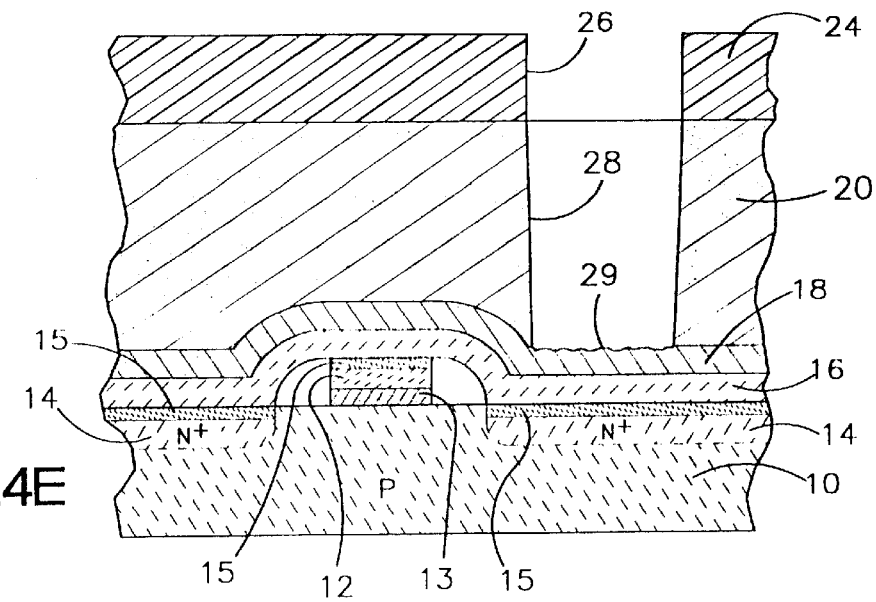

Following the developing of the photoresist layer 24, the $SiO_2$ exposed through the opening 26 is anisotropically etched preferably in a $CHF_3$:$O_2$ atmosphere to form opening 28 in the $SiO_2$ as shown in FIG. 4E. Because of the layer 18 of $Si_xN_y$ has a high Si to N ratio it has a very high selectivity of etch rate as compared to the silicon dioxide 20, the layer 18 $Si_xN_y$ acts as an excellent etch stop material. Never-the-less a certain amount of the layer 18 is removed as shown as 29 in FIG. 4E.

Figure 4F:
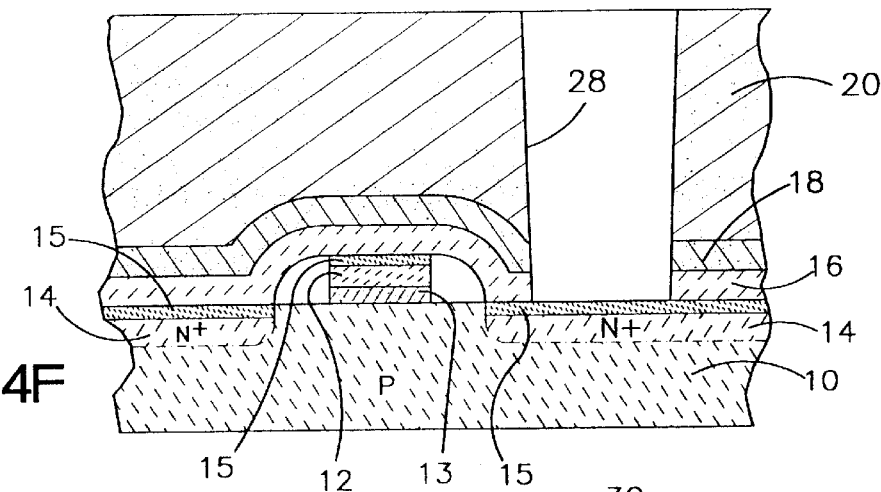

Following the reactive ion etching, the remaining photoresist 24 is stripped and the exposed silicon nitride layers 16 and 18 are removed by dry etching in Ar:$CHF_3$ to provide the structures shown in FIG. 4F.

Figure 4G:
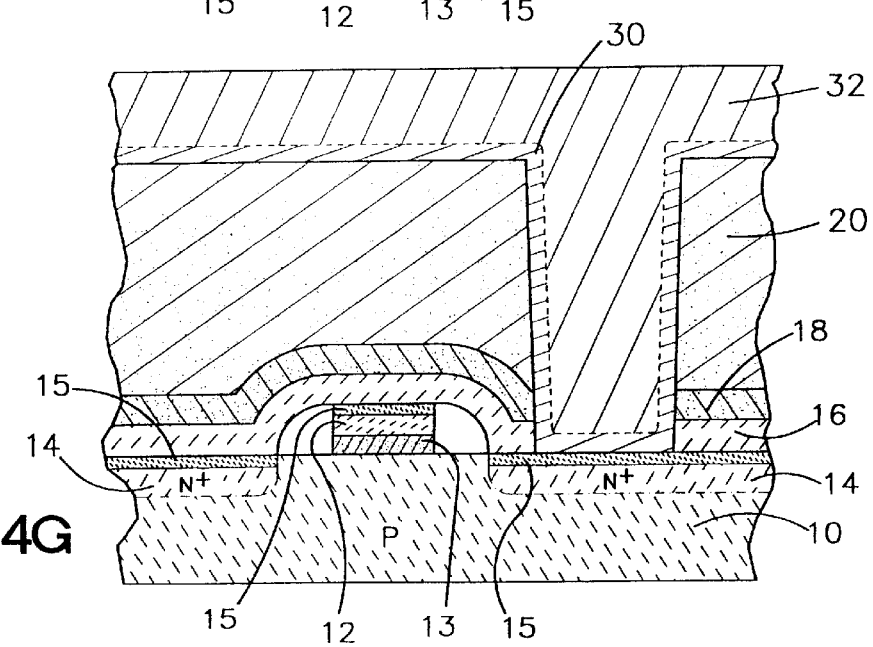

Following the removal of the $Si_xN_y$ layers in openings 26, a contact barrier such as TiN 30 is formed on the $SiO_2$ wall in opening 26 and surface 22 and on the exposed substrate 10. This is followed by deposition of a metal such as Tungsten (W) 32, as shown in FIG. 4G.

That portion of the $Si_xN_y$ layers remaining under the $SiO_x$, which have not been exposed and etched, contain the layer 16 which has excelled resistance to PMIC during subsequent processing. Thus the two layers 16 and 18 have together provided high etch selectivity during RIE of the silicon and also reduced or eliminating PMIC during subsequent processing.

Of course it should be understood that the ratios of Si to N in the two layers can be varied as can be the thicknesses of the two layers. For example if there is more concern for either more etch selectivity or improved barrier to positive mobile ion penetration the thickness of each of the layers 16 and 18 as well as the ratios of Si to N in each layer can be varied. Also, as noted above the layer 18 with high etch selectivity can be formed on the substrate, and the layer 16 with good resistance to PMIC can be formed on the layer 18.

Also it should be understood that in using a conventional tool for forming the silicon nitride, it is possible to provide a barrier which has a gradient throughout; i.e. a structure which at the surface of the substrate has excellent barrier properties to positive mobile ion penetration and then gradually increases the silicon to nitrogen ratio so that the outer surface has high etch selectivity (or vice versa). This can be accomplished by starting with a ratio of $SiH_4$ to $NH_3$ that will provide a ratio of 0.75 of Si to N in the silicon nitride, and then gradually changing the concentrations of $SiH_4$ and $NH_3$ such that at the end of the cycle the ratio of Si to N in the silicon nitride is 1.0 or more.

Thus, according to the present invention an improved etch stop barrier is provided which provides both excellent resistance to positive mobile ion penetration and also very good etched selectivity in the same barrier by having multiple layers of material which are tailored to a specific function.

We claim:

1. A method of reactive ion etching $SiO_2$ comprising the steps of:

providing a silicon substrate comprising a semiconductor device including a gate structure between a first and a second portions of said silicon substrate, forming a barrier of silicon nitride directly on said silicon substrate, said barrier of silicon nitride having a first section and a second section superimposed on each other and coextensive entirely with each other with the first section being in contact with said first and second portions of said silicon substrate and the second section being spaced from said silicon substrate, said first and second sections extending continuously from said first portion of said silicon substrate to said second portion of said silicon substrate over said gate structure, said second section having a ratio of Si:N of at least about 0.8 and providing desired etch selectivity, said first section having a ratio of Si:N of less than about 0.8 and providing desired resistance to positive mobile ion penetration, forming a layer of $SiO_2$ on said barrier of silicon nitride, forming at least one opening through reactive ion etching in said layer of $SiO_2$ using said barrier of silicon nitride as an etch stop layer, removing an exposed portion of said barrier of silicon nitride in said opening to reveal the substrate, and depositing a conductor in said opening and in contact with said substrate.

2. The invention as defined in claim 1 wherein said first section has a ratio of Si:N of about 0.75.

3. The invention as defined in claim 1 wherein said second section has a ratio of Si:N of at least about 1.0.

4. The invention as defined in claim 3 wherein said first section has a ratio of Si:N of about 0.75.

5. The invention as defined in claim 1 wherein said barrier is between 50 and 100 nanometers thick.

6. The invention as defined in claim 5 wherein each of said first and second sections is between about 25 and about 50 nanometers thick.

7. The invention as defined in claim 1 wherein Si:N ratio in the barrier of silicon nitride progressively increases from said substrate through said second section.

8. The invention as defined in claim 1 wherein said exposed portion of the barrier of silicon nitride is removed by dry etching.

9. The invention as defined in claim 8 wherein the dry etch is performed in an $Ar:CHF_3$ atmosphere.

* * * * *